United States Patent [19]

Ribner et al.

[11] Patent Number: 5,682,160
[45] Date of Patent: Oct. 28, 1997

[54] HIGH-ORDER DELTA SIGMA ANALOG-TO-DIGITAL CONVERTER WITH UNIT-DELAY INTEGRATORS

[76] Inventors: David Byrd Ribner, 7 Lillian Terr., Andover, Mass. 01810; David Henry Kenneth Hoe, Hillcrest Village, Apt. 80A4, Schenectady, N.Y. 12309

[21] Appl. No.: 650,282

[22] Filed: May 20, 1996

[51] Int. Cl.⁶ .................................................. H03M 3/02
[52] U.S. Cl. ............................................................. 341/143
[58] Field of Search .............................. 341/143, 76, 77; 375/27, 29, 33

[56] References Cited

U.S. PATENT DOCUMENTS

| | | | |
|---|---|---|---|
| 5,065,157 | 11/1991 | Ribner et al. | 341/143 |
| 5,103,229 | 4/1992 | Ribner | 341/143 |
| 5,117,234 | 5/1992 | Shizawa | 341/143 |
| 5,124,703 | 6/1992 | Kaneaki et al. | 341/77 |
| 5,142,286 | 8/1992 | Ribner et al. | 341/143 |
| 5,148,166 | 9/1992 | Ribner | 341/143 |
| 5,181,032 | 1/1993 | Ribner | 341/143 |
| 5,187,482 | 2/1993 | Tiemann et al. | 341/143 |
| 5,283,578 | 2/1994 | Ribner et al. | 341/143 |
| 5,563,535 | 10/1996 | Corry et al. | 327/105 |

*Primary Examiner*—Brian K. Young
*Attorney, Agent, or Firm*—Marvin Snyder

[57] ABSTRACT

A delta sigma modulator which enables each cascaded integrator to settle independently within a full clock period and uses binomial coefficients in the feedback paths to obtain the required sinusoidal shaping of quantizer error, achieves an increase in both the sampling rate and the order to improve resolution. Using a multi-bit quantizer also improves modulator resolution. In one embodiment, the modulator includes a plurality of cascaded unit-delay integrators and utilizes binomial coefficient scaling in the feedback loop. A multi-bit analog-to-digital converter is coupled to receive the output signal of the cascaded unit-delay integrators. The feedback loop includes a multi-bit digital-to-analog converter coupled to the output of the multi-bit analog-to-digital converter. The output of the digital-to-analog converter is coupled to the inputs of at least the first and second differential summing junctions.

10 Claims, 2 Drawing Sheets

HIGH-ORDER DELTA SIGMA ANALOG-TO-DIGITAL CONVERTER WITH UNIT-DELAY INTEGRATORS

FIELD OF THE INVENTION

This invention relates generally to high-order delta sigma ($\Delta$-$\Sigma$) analog-to-digital (A/D) converters and, more particularly, to high-order delta-sigma converters using unit-delay integrators.

BACKGROUND OF THE INVENTION

High resolution analog-to-digital (A/D) signal conversion can be achieved with lower resolution components through the use of over sampled interpolative (or delta sigma) modulation followed by digital low pass filtering and decimation. Oversampling refers to operation of the modulator at a rate many times greater than the Nyquist rate. Decimation refers to decreasing the sample rate of a signal by appropriate filtering and resampling.

Delta sigma modulators (sometimes referred to as sigma delta modulators) have been used in A/D converters for some time. In general, a delta sigma A/D converter uses an internal A/D converter of modest resolution and a complementary digital-to-analog (D/A) converter in a feedback loop. The feedback loop increases the accuracy of the A/D converter in a manner consistent with the high speed operation afforded by the internal A/D converter.

In known delta sigma A/D converters, resolution is predominantly governed by three factors: the ratio of the modulator clock to the Nyquist rate (typically referred to as the oversampling ratio), the "order" of the modulator, and the number of quantizer bits used in the delta sigma modulator. The "order" of a delta sigma modulator corresponds to the number of times the error (including quantization noise) is integrated with respect to time between the modulator input and the modulator output. A high-order modulator is desirable to increase the noise shaping of the quantization error and hence improve the resolution of the converter.

A typical Nth order single-loop delta sigma modulator includes N−1 delay-free integrators coupled in series, i.e., cascaded. A unit-delay integrator typically is coupled, e.g., via a summation junction, to the output of the last delay-free integrator. With such a structure, the N−1 integrators are constrained to settle within one clock cycle, which requires a high current and a corresponding high power dissipation. In addition, in such a cascade configuration, at least some integrators (e.g., in third and higher order modulators) do not have a full clock period to settle and the clock frequency is limited to allow such higher order integrators to settle within the required time.

It would be desirable to increase both the sampling rate and the order of delta sigma modulators to improve resolution. At least with known single-loop delta sigma modulators, however, increasing sampling rate and the order are in conflict since to increase the order, the number of cascaded integrators which must settle in one clock period is also increased. As a result, increasing the order generally restricts ability to increase the clock period, or oversampling rate.

SUMMARY OF THE INVENTION

A delta sigma modulator with increased sampling rate and order includes, in one embodiment, a plurality of cascaded unit-delay integrators including at least first and second unit-delay integrators and at least first and second differential summing junctions. The input of the first summing junction is coupled to receive an input analog signal and the output of the first summing junction is coupled to the input of the first unit-delay integrator. The input of the second summing junction is coupled to the output of the first integrator and the output of the second summing junction is coupled to the input of the second unit-delay integrator. A multi-bit analog-to-digital converter is coupled to receive the output of the plurality of cascaded unit-delay integrators.

With respect to the feedback loop, a multi-bit digital-to-analog converter is coupled to the output of the multi-bit analog-to-digital converter. The output of the digital-to-analog converter is coupled to the inputs of at least the first and second differential summing junctions. Binomial coefficients $\alpha_i$ used in the feedback loop are:

$$\alpha_i = \binom{N}{i} = \frac{N!}{i! \cdot (N-i)!} \quad (1)$$

Any error introduced by the digital-to-analog converter is not noise shaped and appears directly at the output of the analog-to-digital converter. Therefore, as is known in the art, digital correction of any nonlinearity introduced by the digital-to-analog converter is performed using a RAM look-up table connected to the output of the n-bit analog-to-digital converter.

The above described modulator enables each cascaded integrator to settle independently within a full clock period. The binomial coefficients in the feedback paths are used to obtain the required sinusoidal shaping of quantizer error. The modulator therefore achieves the result of increasing both the sampling rate and the order to improve resolution. Using a multi-bit quantizer also improves modulator resolution and ensures stability.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION

The resolution of delta sigma modulators is given by the relationship:

$$\text{Bits} = (L + 1/2)\log_2 R - \log_2 \left[ \frac{\pi^L}{\sqrt{2L+1}} \right] + \log_2(2^Q - 1) \quad (2)$$

where "Bits" is the number of bits produced by the converter, "R" is the modulator oversampling ratio, "L" is the order of the modulator and "Q" is the number of quantizer bits used in the modulator. Resolution therefore is predominantly governed by the oversampling ratio R, the "order" L of the modulator, and the number Q of quantizer bits.

As established in Equation 1, increasing the order L of the modulator increases modulator resolution. However, since delay free integrators often are used in delta sigma modulators, such integrators all must settle within one clock cycle. This constraint limits the number of integrators, and thus the order, of such modulators.

Figure 1:
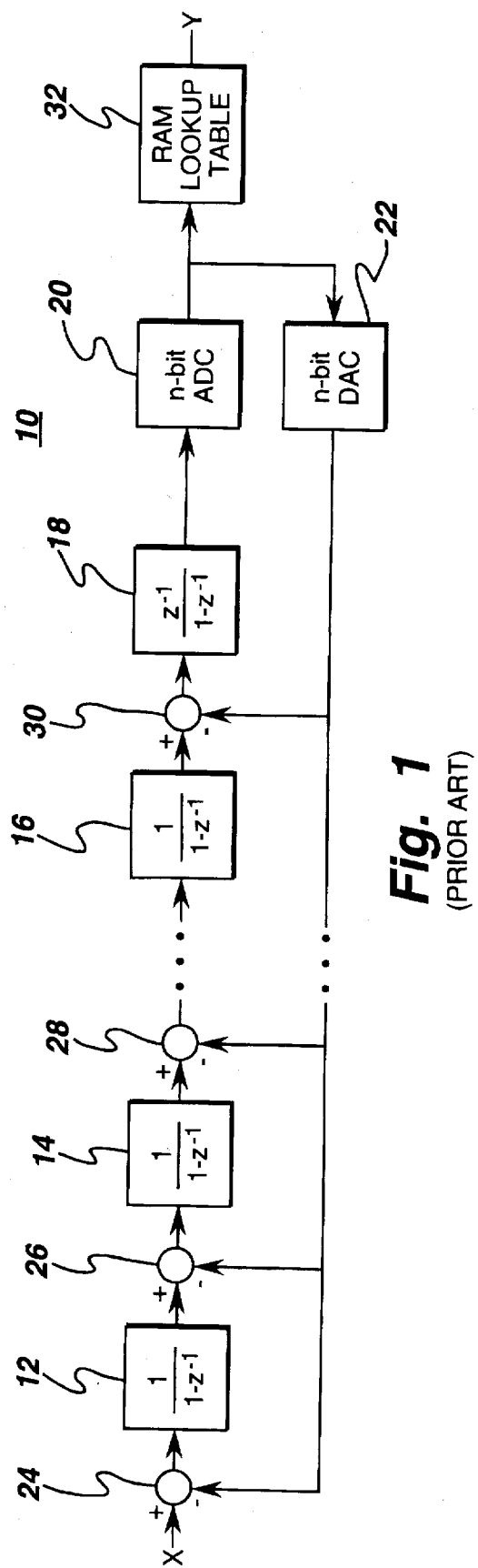
FIG. 1 is a schematic drawing of a known Nth order single-loop delta sigma modulator.

FIG. 1 schematically illustrates a typical Nth order single-loop delta sigma modulator 10 which includes delay-free integrators 12, 14 and 16 coupled in series, i.e., cascaded. A unit-delay integrator 18 is coupled to the output of delay-free integrator 16. An n-bit, or multi-bit, analog-to-digital converter 20 is coupled to the output of unit-delay integrator 18. The output of A/D converter, or quantizer, 20 is coupled to an n-bit, or multi-bit, digital-to-analog converter 22. The output of n-bit digital-to-analog converter 22 is coupled to first, second, third and fourth differential summing junctions 24, 26, 28 and 30.

First differential summing junction 24 is coupled to receive an analog input signal X. The output of first summing junction 24 is coupled to first integrator 12. Second differential summing junction 26 is coupled to the output of first integrator 12 and the output of second junction 26 is coupled to second integrator 14. Third differential summing junction 28 is coupled to the output of second integrator 14 and the output of third junction 28 is coupled to third integrator 16. Fourth differential summing junction 30 is coupled to the output of third integrator 16 and the output of fourth junction 30 is coupled to fourth integrator 18.

Since digital-to-analog converter 22 is in the feedback path of modulator 10, any error introduced by digital-to-analog converter 22 is not noise shaped and appears directly at the output of analog-to-digital converter 20. As is known in the art, digital correction of any nonlinearity introduced by digital-to-analog converter 22 can be performed using a RAM look-up table 32 coupled to the output of n-bit analog-to-digital converter 20.

The architecture of modulator 10 can be used for an arbitrarily high order modulator. Multibit converters 20 and 22 are required for orders L>2 to ensure stability. In modulator 10, however, N−1 delay-free integrators are required to settle within one clock cycle, which requires a high current and corresponding high power dissipation. In addition, in such a cascade configuration of delay-free integrators, at least some integrators (e.g., the third and higher order integrators) do not have a full clock period to settle and the clock frequency is limited to allow such higher order integrators to settle within the required time.

Figure 2:
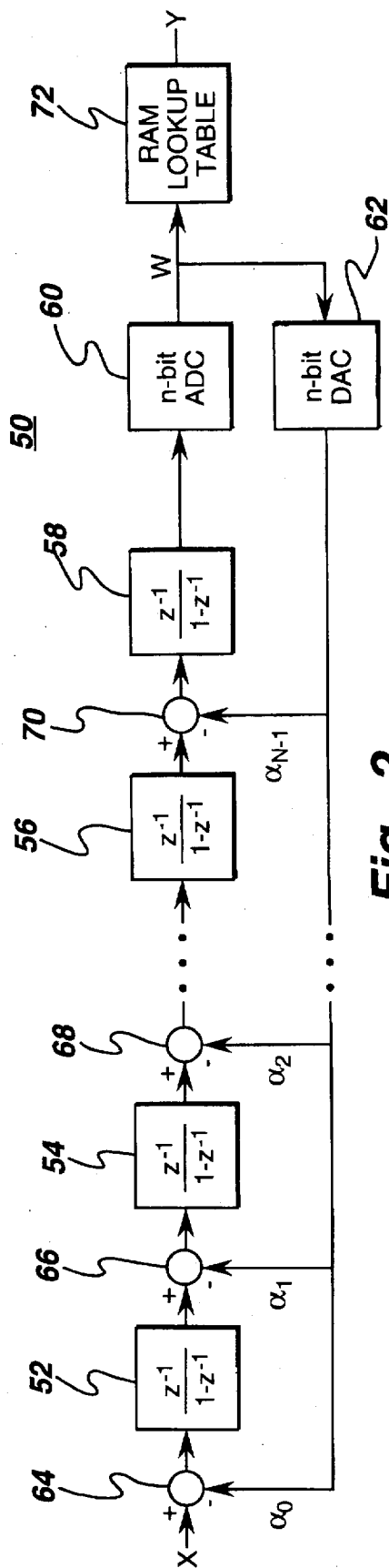
FIG. 2 is a schematic drawing of a known Nth order single-loop delta sigma modulator in accordance with one embodiment of the present invention.

In accordance with one embodiment of the invention, a modulator 50, as shown in FIG. 2, includes cascaded unit-delay integrators 52, 54, 56, and 58. An n-bit, or multi-bit, analog-to-digital converter 60 is coupled to the output of unit-delay integrator 58. The output of A/D converter, or quantizer, 60 is coupled to an n-bit, or multi-bit, digital-to-analog converter 62. The output of n-bit digital-to-analog converter 62 is coupled to first, second, third and fourth differential summing junctions 64, 66, 68 and 70.

First differential summing junction 64 is also coupled to receive analog input signal X. The output of first summing junction 64 is coupled to first integrator 52. Second differential summing junction 66 is coupled to the output of first integrator 52 and the output of second junction 66 is coupled to second integrator 54. Third differential summing junction 68 is coupled to the output of second integrator 54 and the output of third junction 68 is coupled to third integrator 56. Fourth differential summing junction 70 is coupled to the output of third integrator 56 and the output of fourth junction 70 is coupled to fourth integrator 58.

Any error introduced by digital-to-analog converter 62 is not noise shaped and appears directly at the output of analog-to-digital converter 60. Therefore, as is known in the art, digital correction of any nonlinearity introduced by digital-to-analog converter 62 is performed using a RAM lookup table 72 coupled to the output of n-bit analog-to-digital converter 60.

To derive expressions for the coefficients $\alpha_i$ applied to differential summing junctions 64, 66, 68 and 70, output signal Y can be written as $$Y = \frac{H_1}{1+H_2} X + \frac{Q}{1+H_2} \quad (3)$$

where $H_1$ is the transfer function for input signal X to the input of quantizer 60 and $H_2$ is the transfer function for output signal W of quantizer 60 to the input of quantizer 60. For modulator 50 of order N, the quantizer noise Q must be sinusoidally noise shaped (Nth order zero at z=1) as shown:

$$Y = z^{-N} X + (1-z^{-1})^N Q \quad (4)$$

Comparing Equations (3) and (4), the following result is obtained:

$$\begin{aligned} H_2 &= \frac{1}{(1-z^{-1})^N} - 1 \\ &= \left[ 1 + \left( \frac{z^{-1}}{1-z^{-1}} \right) \right]^N - 1 \\ &= \binom{N}{0}\left(\frac{z^{-1}}{1-z^{-1}}\right)^N + \binom{N}{1}\left(\frac{z^{-1}}{1-z^{-1}}\right)^{N-1} + \ldots + \\ &\quad \binom{N}{N-1}\left(\frac{z^{-1}}{1-z^{-1}}\right) \end{aligned} \quad (5)$$

where the last step makes use of the binomial expansion theorem. $H_2$ is given by:

$$H_2 = \alpha_0 \left( \frac{z-1}{1-z^{-1}} \right)^N + \alpha_1 \left( \frac{z-1}{1-z^{-1}} \right)^{N-1} + \ldots + \alpha_{N-1}\left( \frac{z-1}{1-z^{-1}} \right). \quad (6)$$

Therefore, comparing equations (5) and (6), the coefficients $\alpha_i$ are:

$$\alpha_i = \binom{N}{i} = \frac{N!}{i! \cdot (N-i)!} \quad (7)$$

Figure 3:
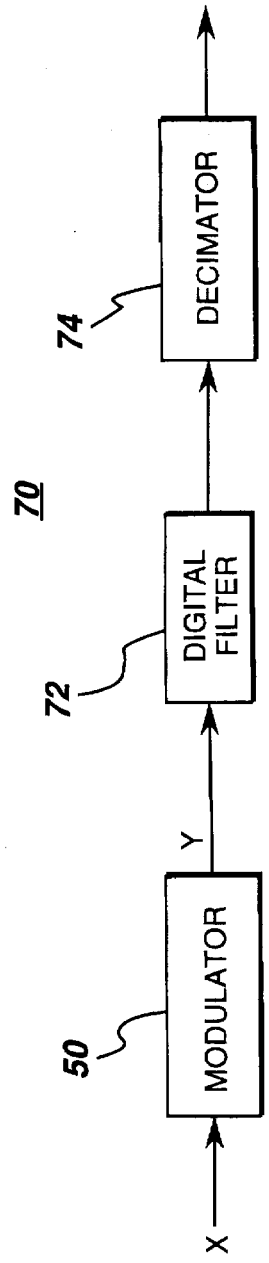
FIG. 3 is a block diagram of the Nth order single-loop delta sigma modulator of FIG. 2 incorporated into a delta sigma analog-to-digital converter.

Modulator 50 enables each integrator 52, 54, 56 and 58 to settle independently within a full clock period. The binomial coefficients in the feedback paths are used to obtain the required sinusoidal shaping of quantizer error. Modulator 50 therefore achieves the result of increasing both the sampling rate and the order of delta sigma modulators to improve resolution. Using multi-bit quantizer 60 improves modulator resolution even further FIG. 3 illustrates modulator 50 of FIG. 2 incorporated into a delta sigma analog-to-digital converter 70. A digital filter 72 performs low pass filtering on the modulator output signal. The filtered modulator output signal is decimated by a decimator 74 to produce an output signal for analog-to-digital converter 70 at a decreased sampling rate.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. An oversampled interpolative modulator for receiving an input analog signal and generating an output digital signal, said modulator comprising:
   a plurality of cascaded unit-delay integrators comprising at least first and second unit-delay integrators and at least first and second differential summing junctions, the input of said first summing junction coupled to receive an input analog signal and the output of said first summing junction coupled to the input of said first integrator, the input of said second summing junction coupled to the output of said first integrator and the output of said second summing junction coupled to the input of said second unit-delay integrator;
   a multi-bit analog-to-digital converter coupled to the output of the cascaded plurality of unit-delay integrators; and
   a multi-bit digital-to-analog converter coupled to the output of said multi-bit analog-to-digital converter, the output of said digital-to-analog converter being coupled to the inputs of each of said differential summing junctions.

2. The oversampled interpolative modulator of claim 1 including a RAM look-up table coupled to the output of said analog-to-digital converter for correcting any nonlinearity in the output signal of said analog-to-digital converter.

3. The oversampled interpolative modulator of claim 1 wherein the cascaded plurality of unit-delay integrators further comprises a third unit delay integrator and a third differential summing junction, the input of said third summing junction coupled to the output of said second integrator and the output of said third summing junction coupled to the input of said third unit-delay integrator.

4. The oversampled interpolative modulator of claim 3 wherein the cascaded plurality of unit-delay integrators further comprises a fourth unit delay integrator and a fourth differential summing junction, the input of said fourth summing junction coupled to the output of said third integrator and the output of said fourth summing junction coupled to the input of said fourth unit-delay integrator, the output of said fourth unit-delay integrator being coupled to the input of said multi-bit analog-to-digital converter.

5. The oversampled interpolative modulator recited in claim 1 wherein the RAM look-up table is adapted to produce an output signal Y, defined as $$Y = \frac{H_1}{1+H_2} X + \frac{Q}{1+H_2}$$

where $H_1$ is a transfer function from the input of said modulator for an input signal X to the input of said multi-bit digital-to-analog converter, $H_2$ is a transfer function from an output to an input of said multi-bit analog-to-digital converter, and Q represents noise in said multi-bit analog-to-digital converter.

6. A delta sigma analog-to-digital converter comprising:
   an oversampled interpolative modulator for receiving an input analog signal to be converted and generating an output digital signal;
   a digital filter coupled to receive the output digital signal of said oversampled interpolative modulator for generating a filtered digital output signal; and
   a decimator coupled to receive the filtered digital output signal of said digital filter for decreasing the sampling rate of said filtered digital output signal;
   said oversampled interpolative modulator comprising:
      a plurality of cascaded unit-delay integrators comprising at least first and second unit-delay integrators and at least first and second differential summing junctions, the input of said first summing junction coupled to receive an input analog signal and the output of said first summing junction coupled to the input of said first integrator, the input of said second summing junction coupled to the output of said first integrator and the output of said second summing junction coupled to the input of said second unit-delay integrator;
      a multi-bit analog-to-digital converter coupled to the output of the cascaded plurality of unit-delay integrators; and
      a multi-bit digital-to-analog converter coupled to the output of said multi-bit analog-to-digital converter, the output of said digital-to-analog converter being coupled to the inputs of each of said differential summing junctions.

7. The delta sigma analog-to-digital converter of claim 6 including a RAM look-up table coupled to the output of said multi-bit analog-to-digital converter for correcting any nonlinearity in the output signal of said multi-bit analog-to-digital converter.

8. The delta sigma analog-to-digital converter of claim 6 wherein the cascaded plurality of unit-delay integrators further comprises a third unit delay integrator and a third differential summing junction, the input of said third summing junction coupled to the output of said second integrator and the output of said third summing junction coupled to the input of said third unit-delay integrator.

9. The delta sigma analog-to-digital converter of claim 8 wherein the cascaded plurality of unit-delay integrators further comprises a fourth unit delay integrator and a fourth differential summing junction, the input of said fourth summing junction coupled to the output of said third integrator and the output of said fourth summing junction coupled to the input of said fourth unit-delay integrator, the output of said fourth unit-delay integrator being coupled to the input of said multi-bit analog-to-digital converter.

10. The delta sigma analog-to-digital converter recited in claim 7 wherein the RAM look-up table is adapted to produce an output signal Y, defined as $$Y = \frac{H_1}{1+H_2} X + \frac{Q}{1+H_2}$$

where $H_1$ is a transfer function from the input of said modulator for an input signal X to the input of said multi-bit digital-to-analog converter, $H_2$ is a transfer function from an output W to an input of said analog-to-digital converter, and Q represents noise in said multi-bit analog-to-digital converter.

* * * * *